United States Patent [19]
Ahn et al.

[11] Patent Number: 5,641,705
[45] Date of Patent: Jun. 24, 1997

[54] DEVICE ISOLATION METHOD OF SEMICONDUCTOR DEVICE

[75] Inventors: Dong-ho Ahn, Ansan; Seong-joon Ahn; Yu-gyun Shin, both of Seoul; Yun-gi Kim, Wonju, all of Rep. of Korea

[73] Assignee: Samsung Electronics Co., Ltd., Suwon, Rep. of Korea

[21] Appl. No.: 470,914

[22] Filed: Jun. 6, 1995

[30] Foreign Application Priority Data

Jun. 8, 1994 [KR] Rep. of Korea ............... 94-12841
Dec. 31, 1994 [KR] Rep. of Korea ............... 94-40685

[51] Int. Cl.$^6$ ................................................. H01L 21/76
[52] U.S. Cl. ........................................ 438/448; 438/452
[58] Field of Search ........................... 437/69, 70, 72, 437/73, 927

[56] References Cited

U.S. PATENT DOCUMENTS 5,326,715  7/1994  Jang et al. .......................... 437/69
5,393,692  2/1995  Wu .................................... 437/69

FOREIGN PATENT DOCUMENTS 0068929  3/1990  Japan ................................. 437/69

*Primary Examiner*—Trung Dang
*Attorney, Agent, or Firm*—Cushman Darby & Cushman, IP Group Of Pillsbury Madison & Sutro LLP

[57] ABSTRACT

In a device isolation method for a semiconductor device, after a pad oxide layer and a nitride layer are formed on a semiconductor substrate, the nitride layer located above the device isolation region is removed. An undercut is formed under the nitride by partially etching the pad oxide layer. After a first oxide layer is formed on the exposed substrate and a polysilicon spacer is formed on the sidewalls of the nitride layer, a void is formed in the oxide layer under the nitride layer which is formed on the active region by oxidizing the resultant structure in which the polysilicon spacer is formed at a temperature above 950° C. Thus, good cell definition and stable device isolation can be realized, while solving the typical problem of conventional LOCOS methods by forming the void intentionally in the pad oxide layer thickened by bird's beak punch through.

9 Claims, 8 Drawing Sheets

DEVICE ISOLATION METHOD OF SEMICONDUCTOR DEVICE

BACKGROUND OF THE INVENTION

The present invention relates to a device isolation method for a semiconductor device and, more particularly, to device isolation method for a semiconductor device for intentionally forming a void in a pad oxide layer thickened by a bird's beak punch through phenomenon resulting from use of a device isolation method using a local oxidation of silicon (LOCOS) process.

Along with the recent trend toward higher integration of semiconductor devices, the research and development of a device isolation technology (micro-technology) has been actively advanced. The formation of a device isolation region is an initial step in the semiconductor manufacturing process, and it determines the size of an active region and defines the process margin of all subsequent manufacturing process steps. Isolation has been achieved by the LOCOS method.

FIGS. 1A–1D show a method for forming a field oxide layer by a conventional LOCOS method.

As shown in FIG. 1A, after pad oxide layer 12 is formed on semiconductor substrate 10, nitride layer 14 is formed thereon.

As shown in FIG. 1B, photoresist is coated and patterned on nitride layer 14 to form photoresist pattern 16. Next, impurities of the same conductive type as the substrate are ion-implanted on the whole surface of the substrate, to form a channel stop region.

As shown in FIG. 1C, after nitride layer 14 is etched using photoresist pattern 16 as an etching mask and the photoresist pattern is removed, a thermal oxidation process is performed such that field oxide layer 18 is formed in the device isolation region of the substrate. At this time, channel stop region 20 is formed below field oxide layer 18.

As shown in FIG. 1D, device isolation is realized by removing nitride layer 14 and pad oxide layer 12.

It is well known, however, that in the LOCOS method serious problem results from formation of the bird's beak structure. The bird's beak structure occurs, because oxygen permeates to the side surface of the pad oxide layer under the nitride layer used as an oxidation prevention mask and the silicon under the nitride layer becomes oxidized. Further, in higher integration semiconductor devices, the cell interval in the active region becomes smaller. In the conventional LOCOS technology, as described above, it is impossible to prevent the bird's beak, punch-through, phenomenon by which adjacently formed bird's beaks make contact with each other under the nitride layer. If the cells are overlapped, this above phenomenon is especially serious at the end of the cells where the bird's beaks extend in three directions.

In the "P" end of an overlapped cell,shown in FIGS. 2 and 3A–3C, the bird's beaks contact each other as a result of bird's beak punch-through phenomenon and the pad oxide layer 18 located under nitride layer 14 is thickened (FIGS. 3A and 3C). The bird's beak phenomenon is not serious, in the central portion of the cell (FIG. 3B).

When the bird's beak punch-through phenomenon is generated, the definition of the active region becomes virtually impossible. Also, to form the active region, the oxide layer thickened by the bird's beak punch-through phenomenon must be removed. To remove the thickened oxide layer, an over-etching process needs to be performed. Here, however, due to the over-etching performed to the field oxide layer as well as to the thickened oxide film, element characteristics deteriorate or the actual device isolation becomes impossible (see FIG. 8A).

SUMMARY OF THE INVENTION

It is an object of the present invention to provide the device isolation method for manufacturing a semiconductor device which results in proper device isolation and cell definition, despite the a bird's beak punch through phenomenon.

To accomplish the above object, the device isolation method, according to the present invention includes the steps of: forming a pad oxide layer and a nitride layer on a semiconductor substrate; removing the nitride layer over a device isolation region; forming an undercut under said nitride layer by partially etching the pad oxide layer; forming a first oxide layer on the exposed substrate; forming a polysilicon spacer on the sidewalls of the nitride layer; and selectively oxidizing the resultant structure in which the polysilicon spacer is formed.

Here, it is preferable that the selective oxidation process is executed at a temperature at 950° C. or above, and a void is formed in an oxide layer located under the nitride layer which is formed on an active region.

According to a preferable embodiment of the present invention, the polysilicon spacer is formed so that the polysilicon is filled in the undercut and the first oxide layer has a thickness of 30–160 Å.

On the other hand, the polysilicon spacer can be formed lower than the nitride layer by over-etching a polysilicon spacer, as necessary.

To accomplish the above object, the device isolation method for manufacturing a semiconductor device includes the steps of: forming a pad oxide layer and a nitride layer on a semiconductor substrate; removing the nitride layer on a device isolation region; forming an undercut under said nitride layer by partially etching the pad oxide layer; etching the substrate by using the nitride layer as an etching mask; forming a first oxide layer on the exposed substrate; forming a polysilicon spacer on the sidewalls of the nitride layer and of the etched portion of the substrate under said nitride layer; and selectively oxidizing the resultant structure in which the polysilicon spacer is formed and forming a void in an oxide layer located under the nitride layer formed on an active region.

According to a preferable embodiment of the present invention, the substrate is etched to 200–1000 Å, and the selective oxide process is executed at a high temperature greater than 950° C.

Also, the polysilicon spacer is formed so that the polysilicon is filled in the undercut and the first oxide layer has a thickness of 30–160 Å.

On the other hand, the polysilicon spacer can be formed lower than the nitride layer by over-etching the polysilicon spacer, as necessary.

A void is intentionally formed in the oxide layer thickened by the bird's beak punch-through structure so that the problem of the conventional LOCOS method can be solved and stable device isolation and proper cell definition can be realized.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

One embodiment of a device isolation method according to the present invention will be explained in detail, with reference to FIGS. 4 to 7E.

Figure 1A:
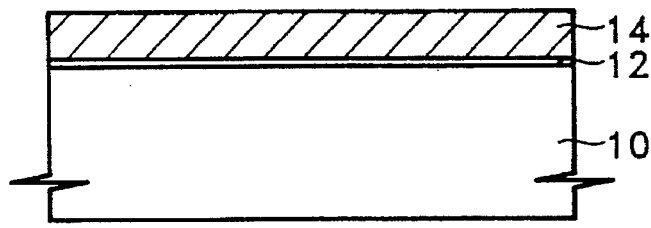
FIGS. 1A–1D are cross-sectional views showing the sequential process steps for forming a field oxide layer by the conventional LOCOS method.
Figure 1B:
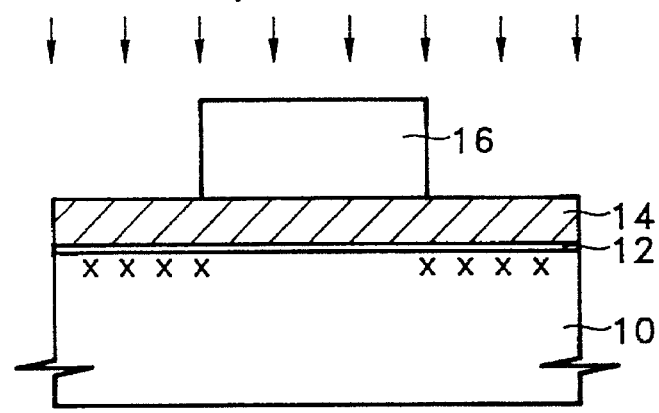
Figure 1C:
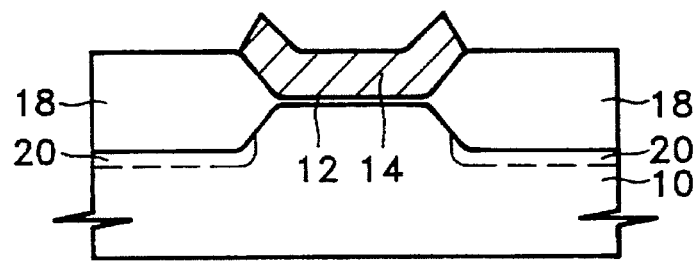
Figure 1D:
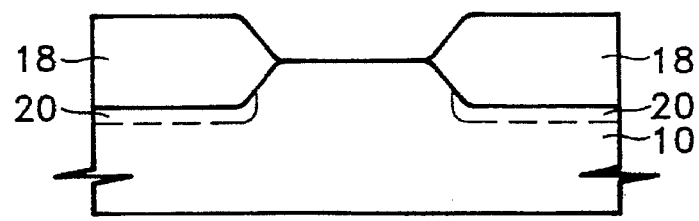
Figure 2:
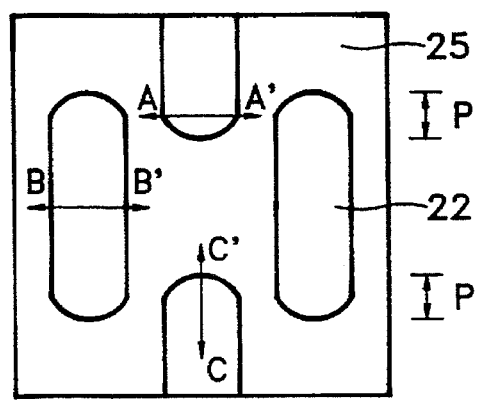
FIG. 2 is a plan view of one example of a conventional cell array.
Figure 3A:
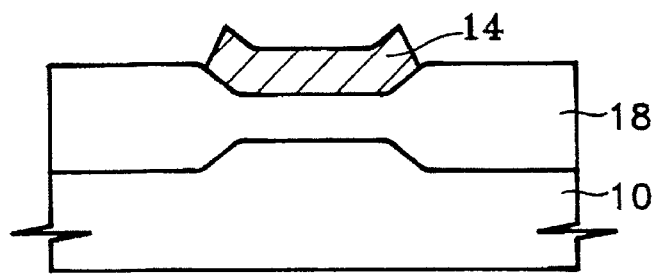
FIGS. 3A–3C are cross-sectional views taken along the lines A-A', B-B' and C-C' of FIG. 2.
Figure 3B:
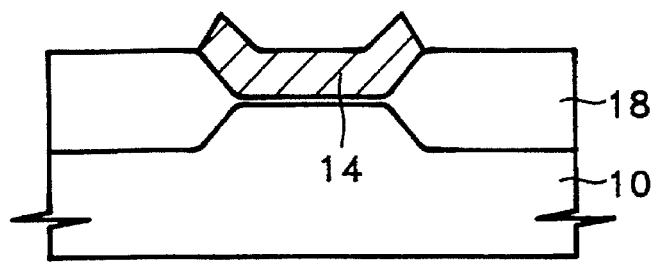
Figure 3C:
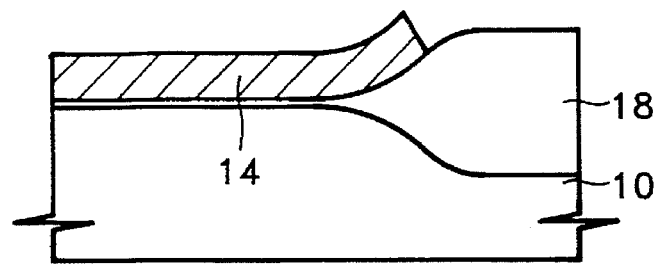
Figure 4:
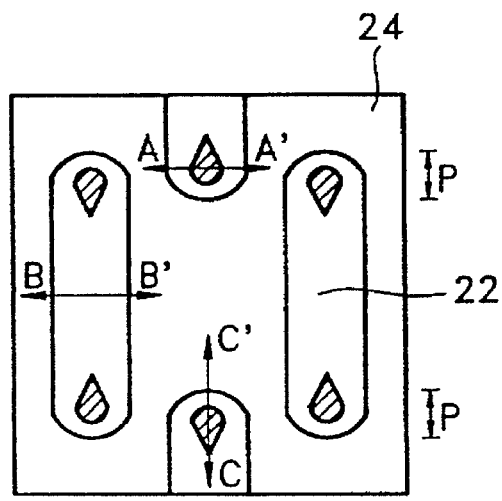
FIG. 4 is a plan view of an element cell array according to one embodiment of the present invention.

In FIG. 4, reference numeral 22 indicates a cell, reference numeral 24 indicates an inactive region in which a field oxide layer is formed, and the letter "P" indicates a portion of the semiconductor device in which cells are overlapped. As shown in FIG. 4, voids "V" are formed in both ends of overlapped cell 22.

Figure 5A:
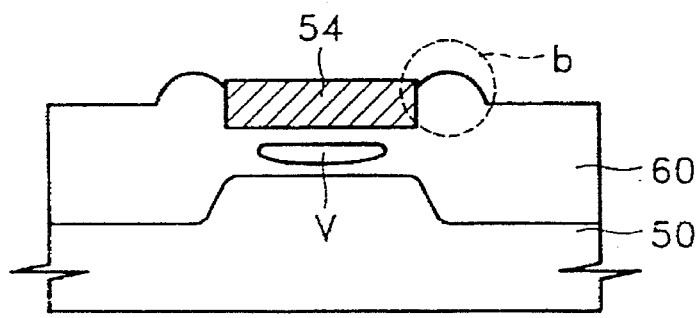
FIGS. 5A–5C are cross-sectional views taken along the lines A-A', B-B' and C-C' of FIG. 4.
Figure 5B:
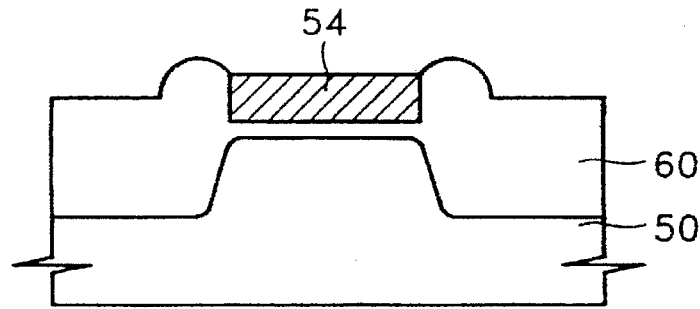
Figure 5C:
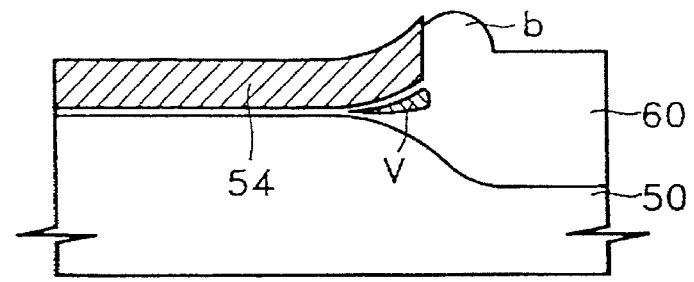

FIGS. 5A–5C are used in comparing a conventional device isolation method with the device isolation method according to the present invention. Here, reference numeral 50 indicates a semiconductor substrate, reference numeral 54 indicates a nitride layer, reference numeral 60 indicates a field oxide layer, reference character V indicates a void, and reference character b indicates the bump of the oxidation layer.

FIGS. 5A and 5C show the cross sections of A-A' and C-C', respectively, of FIG. 4, and in particular, the ends of the cell in which bird's beaks extend in three directions. The bird's beak punch-through phenomenon causes the bird's beaks to contact each other, and void V is formed in the thickened pad oxide layer located under the nitride layer. On the other hand, FIG. 5B shows the B-B' cross section of the cell shown in FIG. 4, in which the bird's beaks extend in two directions, and it can be seen that the bird's beak punch through phenomenon is not generated.

Over-etching has been traditionally carried out in order to remove the oxide layer under the nitride layer thickened by the bird's beak phenomenon. Accordingly, the oxide layer below the nitride layer in the B-B' region (where the bird's beak punch through phenomenon is not generated) became very thin, which deteriorated certain element characteristics. According to the embodiment of the present invention, however a void is formed in the oxide layer under the nitride layer where the punch through is generated, to thereby thin the resultant oxide layer and obrieate the need for over-etching. Thus, deterioration of element characteristics is prevented and stable device isolation is obtained.

FIGS. 6A to 6G are cross-sectional views showing the sequential process steps a first embodiment in accordance with a device isolation method of the present invention.

Figure 6A:
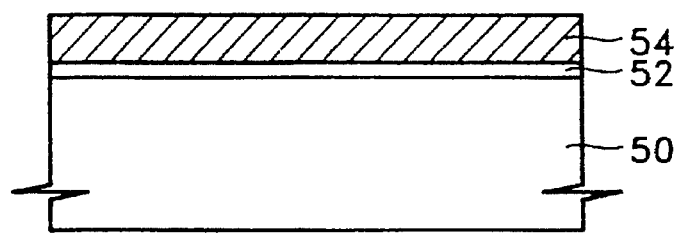
FIGS. 6A–6G are cross-sectional views showing the sequential process steps according to a first embodiment of a device isolation method of the present invention.

FIG. 6A is a drawing showing the step of forming a pad oxide layer 52 and nitride layer 54 on a semiconductor substrate 50.

After pad oxide layer 52, having a thickness of of about 300 Å, is grown on semiconductor substrate 50 by a thermal oxidation method, the nitride layer having a thickness of 1500–2500 Å, is stacked on pad oxide layer 52 by a low-pressure chemical vapor deposition (LPCVD) method.

Figure 6B:
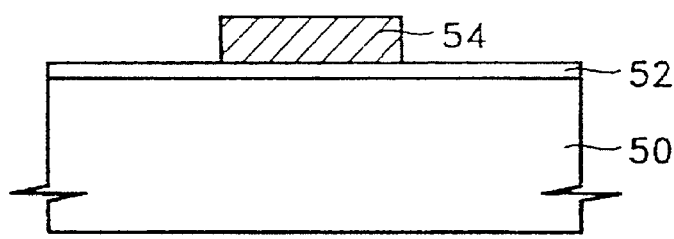

FIG. 6B is a drawing showing the step of patterning nitride layer 54.

After a photoresist is coated on the resultant structure in which the nitride layer is formed, a photoresist pattern (not shown) is formed by applying a mask pattern for defining an active region and an device isolation region. Next, nitride layer 54 over the device isolation region is removed and the active region is defined by using the photoresist pattern as an etching mask and etching the nitride layer.

Figure 6C:
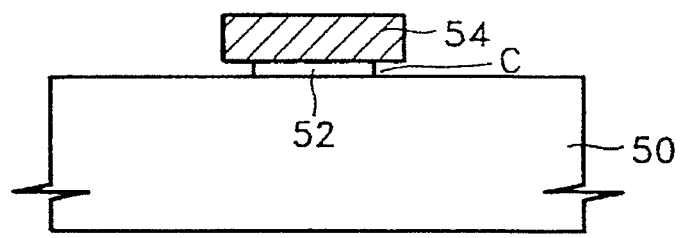

FIG. 6C is a drawing showing the step of forming an undercut under nitride layer 54.

Undercut "C" is formed under nitride layer 54 by partially etching pad oxide layer 52. At this time, it is preferable to use a wet etching in an etching process.

Figure 6D:
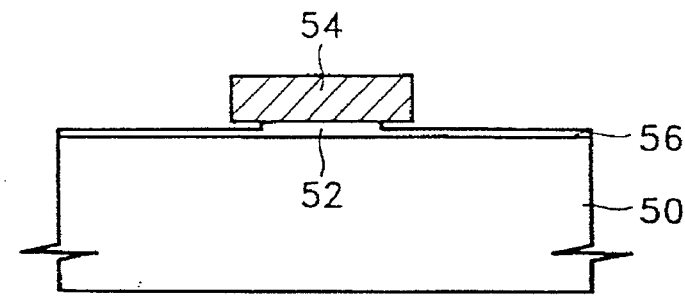

FIG. 6D is a drawing showing the step of forming first oxide layer 56.

First oxide layer 56 is formed thinner than the above described pad oxide layer, for example, to a thickness of 30–160 Å on the resultant structure in which undercut C is formed.

Here, first oxide layer 56 is formed so as to prevent defects in the silicon substrate, resulting from stress applied to the silicon substrate at the time of a subsequent thermal oxidation process for forming the field oxide layer. Also, the first oxide layer has a uniform thickness over the whole surface of the isolation region and the adjustment of the thickness can easily be accomplished. Therefore, it is possible to adjust the size of the bird's beak easily, because the bird's beak is formed depending on the thickness of the pad oxide layer. However, if the thickness of the pad oxide layer located under the nitride layer becomes thinner by more than a certain thickness, say, one third that of the nitride layer, a dislocation is caused in the silicon substrate which exerts a negative influence on the electrical characteristics of the device. Accordingly, there is a fundamental limitation in reducing the thickness of the pad oxide layer. The size of the bird's beak can be adjusted easily, however, by forming the undercut and the first oxide layer having a uniform thickness which is thinner than the pad oxide layer.

Figure 6E:
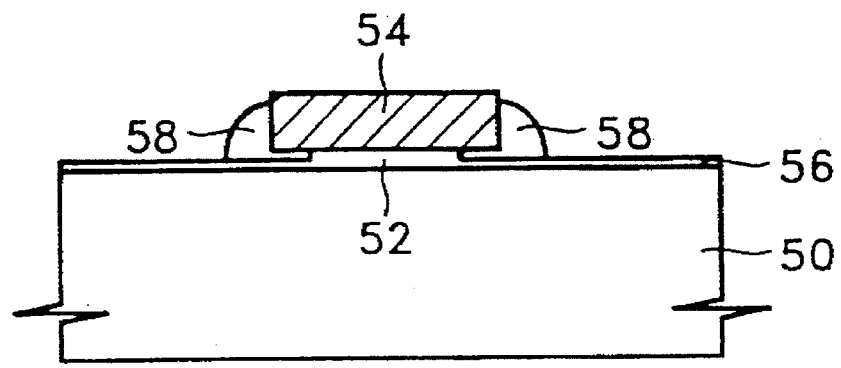

FIG. 6E is a drawing showing the process for forming a polysilicon spacer 58.

After polysilicon is deposited onto the whole surface of the resultant structure in which first oxide layer 56 is formed, spacer 58 is formed on the sidewalls of nitride layer 54 by anisotropically etching the deposited layer. At this time, polysilicon spacer 58 fills in the undercut region C under nitride layer 54.

On the other hand, after the polysilicon is deposited and the spread thickness is etched as needed, 20–30% over-etching can be executed so that polysilicon spacer 58 is formed with a lower profile than the nitride layer. The polysilicon spacer 58 with a lower profile prevents problems caused by the polysilicon bump (See "b" in FIG. 6F) formed in subsequent oxide process. The problems include the impossibility of subsequent processing, caused by the unetched bump, and deterioration of electrical characteristics of the element, caused by a thin field oxide layer resulting from over-etching to remove the bump.

Figure 6F:
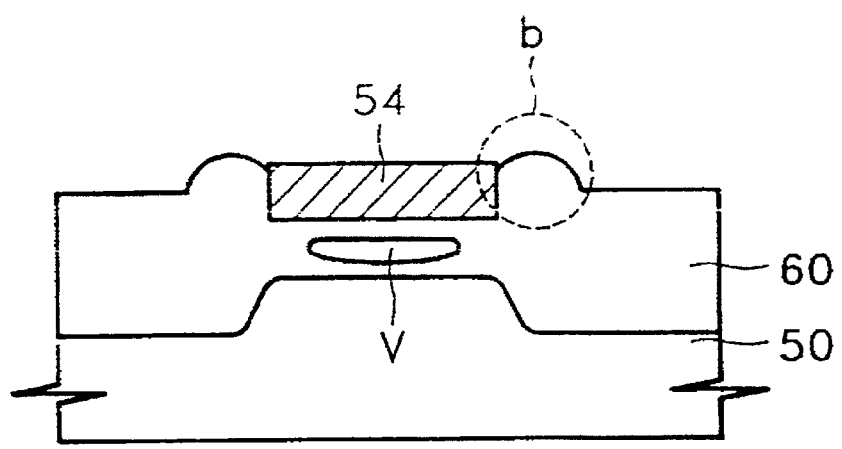

FIG. 6F is a drawing showing the step of proceeding the thermal oxidation process step.

The oxidation process is carried out on the resultant structure in which the polysilicon spacer is formed, and field oxide layer 60 is formed in the device isolation region. At this time, void V is formed in the pad oxide layer below nitride layer 54 (see SEM photographs of FIGS. 9A and 9B).

The spacer formed on the sidewalls of the nitride layer is oxidized, and bump b of the oxide layer is formed. Nitride layer 54 receives an upward force by a volume expansion generated during the oxidation of the polysilicon formed in the undercut region and on the sidewalls of nitride layer 54 in the beginning of the oxidation process. The longer the oxidation process is carried out, the stronger the force for lifting the nitride layer becomes.

On the other hand, if the oxidation process is performed at high temperature, for example, 950°–1150° C., the oxygen diffuses rapidly, and the bird's beak phenomenon is generated beneath the nitride layer. If the oxidation process is continued, the bird's beak punch-through phenomenon in which adjacent bird's beaks contact each other under the nitride layer is generated.

At this time, while oxygen is supplied through the pad oxide layer as in the conventional method, and the oxide layer is formed in between the nitride layer and the silicon substrate, the first oxide layer formed under the polysilicon spacer becomes the supply path of the oxygen in accordance with the present invention. Since the first oxide layer is very thin, the oxygen cannot be supplied between the nitride layer and the substrate. Accordingly, if the oxidization continues, the nitride layer receives a stronger upward force. If the coupling force of the silicon substrate and the pad oxide layer is weaker than the force lifting the nitride layer, the pad oxide layer and the silicon substrate are separated. Conventionally, the oxygen is supplied before separation of oxide layer and silicon substrate, the oxide layer is formed under the pad oxide layer, and the separated portion is filled in by the volume expansion. In the case of the present however, since the oxygen is not supplied well, the separated portion is not filled in. If the oxidation process continues, void V is formed in the portion separating the pad oxide layer and the silicon substrate. The void increases in size as the oxidation process proceeds.

Figure 6G:
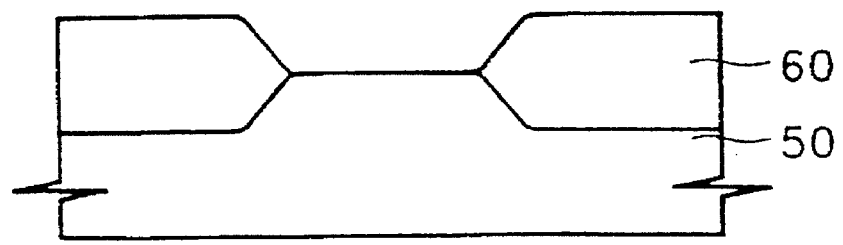

FIG. 6G is a drawing showing the step of forming field oxide layer 60.

Figure 8A:
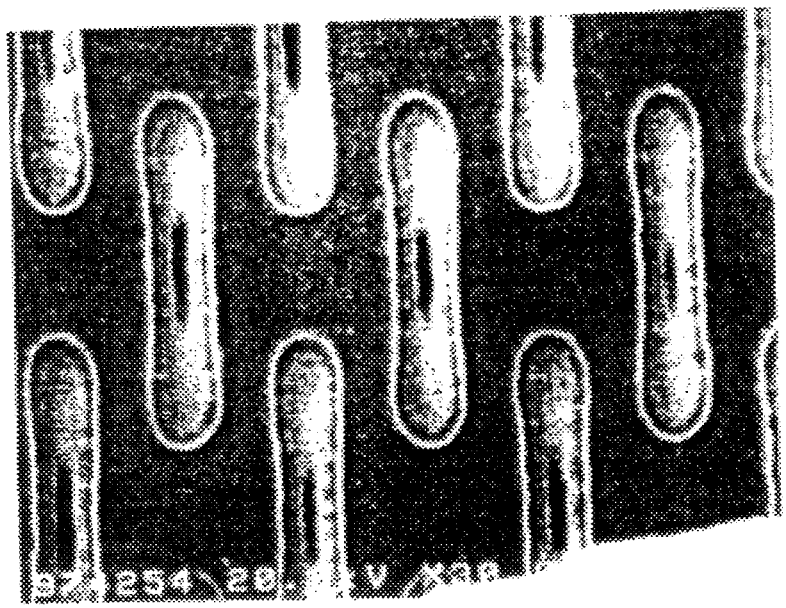
FIGS. 8A and 8B are SEM photographs of a cell formed by a conventional method and one formed by the method of the present invention, respectively.
Figure 8B:

The cell is defined by removing nitride layer 54, etching back the oxide layer in which the void located under the nitride layer is formed, and forming field oxide layer 60 (see to FIG. 8B).

According to the first embodiment of the present invention, since the void is formed intentionally in the pad oxide layer, the typical problem of the conventional LOCOS method can be solved. FIGS. 7A to 7E are sequential process drawings depicting a second embodiment of the device isolation method according to the present invention, The same reference numbers in FIGS. 6A to 6G and FIGS. 7A to 7E denote the same element. The second embodiment is carried out in the same way as the first embodiment, except that semiconductor substrate 50 is etched to a predetermined depth, after the step (FIG. 6C) forming the undercut "C" is completed.

Figure 7A:
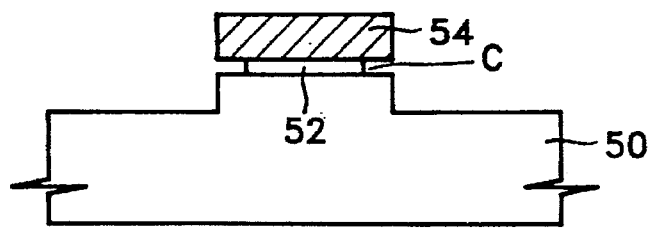
FIGS. 7A to 7E are cross-sectional views showing the sequential process steps according to a second embodiment of the device isolation method of the present invention.

FIG. 7A depicts the step of etching semiconductor substrate 50.

Substrate 50 is etched to a predetermined thickness, for example, around 200–1000 Å by using nitride layer 54 as an etching mask.

Figure 7B:
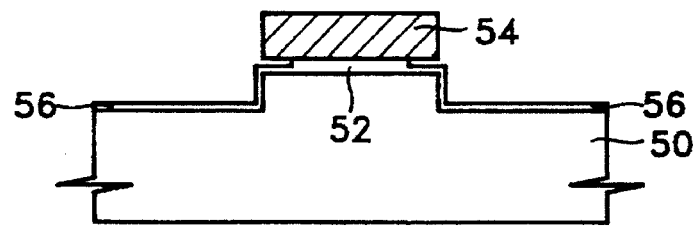

FIG. 7B depicts the step of forming first oxide layer 56.

First oxide layer 56 is formed thinner than the pad oxide layer, for example, 30–160 Å thick on the resultant structure, similarly the first embodiment.

Figure 7C:
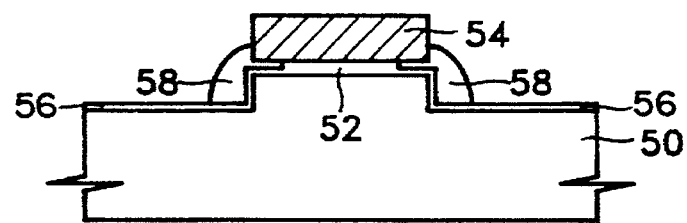

FIG. 7C depicts the process of forming polysilicon spacer 58. Spacer 58 is formed on the sidewall of nitride layer 54 and on the etched portion of the substrate under said nitride layer, by anisotropically etching after polysilicon is coated on the whole surface of the resultant structure in which first oxide layer 56 is formed. At this time, polysilicon spacer 58 is formed to fill the undercut "C" located under nitride layer 54.

On the other hand, if desired, the polysilicon may be over-etched by 20–30% to make the polysilicon spacer 58 lower than the nitride layer.

Figure 7D:
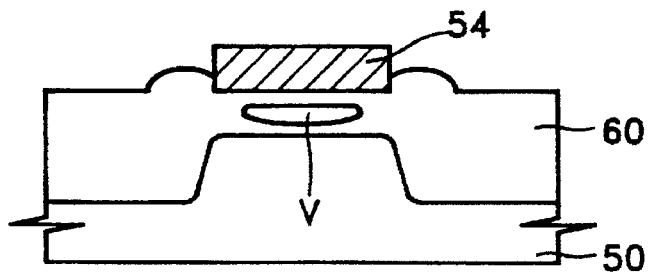

FIG. 7D depicts the thermal oxidation process.

The oxidation process is executed with respect to the resultant structure in which the polysilicon spacer is formed, and field oxide layer 60 is formed in the device isolation region. At this time, the void V is formed inside the pad oxide layer located under nitride layer 54 as in the first embodiment.

Figure 7E:
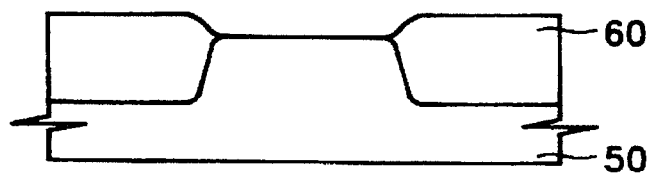

FIG. 7E depicts the step of forming field oxide layer 60.

The cell is defined by removing nitride layer 54, etching back the oxide layer in which the void is formed under the nitride layer, and forming field oxide layer 60.

According to the second embodiment, since the void is formed intentionally, the typical problem of the conventional LOCOS method can be solved. Also, since the oxide process is executed after the silicon substrate of the device isolation region is etched by a predetermined thickness, field oxide layer 60 is formed deeper than in the conventional method and a superior device isolation characteristic can be obtained.

FIG. 8A is a SEM photograph of a conventional cell. Since the over-etching process is performed to remove the oxide layer thickened by the bird's beak punch-through phenomenon, even part of the field oxide layer is removed so that the definition of the cell is not clear.

FIG. 8B is a SEM photograph of a cell according to the present invention. Since there is no need to perform over-etching due to the void formed in the pad oxide layer located under the nitride layer, the definition of the cell is clear.

Figure 9A:
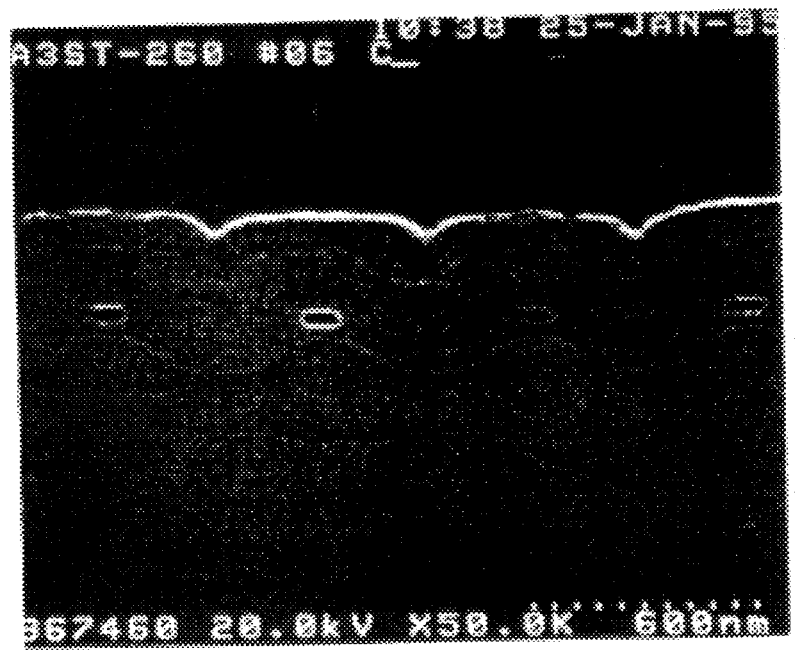
FIGS. 9A and 9B are SEM photographs showing the shape of a void formed by the method of the present invention.
Figure 9B:

FIGS. 9A and 9B are cross sectional views showing the void shape taken along the lines A-A' and C-C' of FIG. 4, respectively, after the thermal oxidation process. Here, the void is formed in the pad oxide layer located under the nitride layer.

According to the present invention, it is possible to adjust the size of the bird's beak easily by forming an undercut region under the nitride layer and the thin oxidation layer. The typical problems of a conventional LOCOS method are solved and good cell definition and stable device isolation can be realized by forming the void intentionally in the pad oxide layer thickened by the punch through.

The present invention is not limited to the above embodiment in that many modifications can be made thereto by those of ordinary skill in the art.

What is claimed is:

1. A device isolation method for a semiconductor device comprising the steps of:

forming a pad oxide layer and a nitride layer on a semiconductor substrate;

removing said nitride layer located over a device isolation region;

forming an undercut region under said nitride layer by partially etching said pad oxide layer;

forming a first oxide layer on the exposed substrate having a predetermined thickness according to an amount of oxygen supplied during subsequent oxidation;

forming a polysilicon spacer on the sidewalls of said nitride layer; and selectively oxidizing the resultant structure in which said polysilicon spacer is formed at a temperature between about 1050° C. and 1150° C. and continuing oxidation until a void is formed in said pad oxide layer located under said nitride layer formed on an active region.

2. A device isolation method for a semiconductor device according to claim 1, wherein said polysilicon spacer being formed so that polysilicon is filled in said undercut region.

3. A device isolation method for a semiconductor device according to claim 1, said first oxide layer having said predetermined thickness of 30–160 Å.

4. A device isolation method for a semiconductor device according to claim 1, said polysilicon spacer being formed lower than said nitride layer by over-etching a polysilicon layer at the time of forming said polysilicon spacer.

5. A device isolation method for a semiconductor device comprising the steps of:

forming a pad oxide layer and a nitride layer on a semiconductor substrate;

removing said nitride layer located on a device isolation region;

etching said substrate by using said nitride layer as an etching mask;

forming an undercut region under said nitride layer by partially etching said pad oxide layer;

forming a first oxide layer on the exposed substrate having a predetermined thickness according to an amount of oxygen supplied during subsequent oxidation;

forming a polysilicon spacer on the sidewalls of said nitride layer and on the etched portion of the substrate under said nitride layer; and selectively oxidizing the resultant structure in which said polysilicon spacer is formed at a temperature between about 1050° C. and 1150° C. and continuing oxidation until a void is formed in said pad oxide layer located under said nitride layer formed on an active region.

6. A device isolation method for a semiconductor device according to claim 5, said substrate being etched to 200–1000 Å.

7. A device isolation method for a semiconductor device according to claim 5, said polysilicon spacer being formed so that the polysilicon is filled in said undercut.

8. A device isolation method for a semiconductor device according to claim 5, said first oxide layer having said predetermined thickness of 30–160 Å.

9. A device isolation method for a semiconductor device according to claim 5, further comprising the step of forming polysilicon layer lower than said nitride layer by over-etching said polysilicon layer at the time of forming said polysilicon spacer.

* * * * *